(12) United States Patent
Ohguro

(10) Patent No.: US 7,679,142 B2
(45) Date of Patent: Mar. 16, 2010

(54) SEMICONDUCTOR WAFER, SEMICONDUCTOR DEVICE AND MANUFACTURING METHOD OF SEMICONDUCTOR DEVICE

(75) Inventor: Tatsuya Ohguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 798 days.

(21) Appl. No.: 11/399,603

(22) Filed: Apr. 7, 2006

(65) Prior Publication Data

US 2006/0261410 A1 Nov. 23, 2006

(30) Foreign Application Priority Data

May 18, 2005 (JP) ............... 2005-145592

(51) Int. Cl.
*H01L 27/01* (2006.01)
(52) U.S. Cl. ............... 257/350; 257/351; 257/E27.112; 257/E29.273
(58) Field of Classification Search ................. 257/350, 257/351, E29.273, E27.112; 438/153
See application file for complete search history.

(56) References Cited

U.S. PATENT DOCUMENTS

| | | | | |
|---|---|---|---|---|
| 5,081,062 A | * | 1/1992 | Vasudev et al. ............. | 438/412 |
| 5,847,419 A | * | 12/1998 | Imai et al. .................... | 257/192 |
| 6,229,179 B1 | * | 5/2001 | Song et al. ................... | 257/350 |
| 6,448,114 B1 | | 9/2002 | An et al. | |
| 6,835,981 B2 | * | 12/2004 | Yamada et al. ............... | 257/347 |
| 7,034,362 B2 | * | 4/2006 | Rim ........................... | 257/351 |
| 2002/0139977 A1 | * | 10/2002 | Bae et al. ...................... | 257/48 |

OTHER PUBLICATIONS

K. Washio et al., "A 0.2 μm 180-GHz-$f_{max}$ 6.7-ps-ECL SOI/HRS Self-Aligned SEG SiGe HBT/CMOS Technology for Microwave and High-Speed Digital Applications," IEEE, IEDM 2000, pp. 741-744.
S. Maeda et al., "Impact of 0.18 μm SOI CMOS Technology using Hybrid Trench Isolation with High Resistivity Substrate on Embedded RF/Analog Applications," Symposium on VLSI Technology Digest of Technical Papers, 2000.

* cited by examiner

Primary Examiner—Tuan N. Quach
(74) Attorney, Agent, or Firm—Foley & Lardner LLP

(57) ABSTRACT

A semiconductor wafer includes a semiconductor bulk; a first insulating layer formed on the semiconductor bulk; a first semiconductor layer formed on the first insulating layer; a second insulating layer formed on the first semiconductor layer; and a second semiconductor layer formed on the second insulating layer.

6 Claims, 10 Drawing Sheets

100 — SEMICONDUCTOR WAFER
10 — SEMICONDUCTOR BULK
20 — FIRST BURIED INSULATING LAYER
30 — FIRST SEMICONDUCTOR LAYER
40 — SECOND BURIED INSULATING LAYER
50 — SECOND SEMICONDUCTOR LAYER
60,70 — STI
91,93 — SOURCE/DRAIN
92 — GROUND CONTACT
98 — CHANNEL REGION
99 — BODY REGION

DIGITAL REGION

ANALOGUE REGION

SEMICONDUCTOR WAFER, SEMICONDUCTOR DEVICE AND MANUFACTURING METHOD OF SEMICONDUCTOR DEVICE

CROSS-REFERENCE TO RELATED APPLICATION

This application is based upon and claims the benefit of priority from the prior Japanese Patent Applications No. 2005-145592, filed on May 18, 2005, the entire contents of which are incorporated herein by reference.

BACKGROUND OF THE INVENTION

1. Field of the Invention

The present invention relates to a semiconductor wafer, semiconductor device and manufacturing method of a semiconductor device, 2. Related Art Elements used in digital circuits are required to operate at high speeds in response to a high-frequency signal. On the other hand, to enhance the performance of analog circuits used in cellular phones, reduction of substrate noise (high-frequency noise), reduction of 1/f noise and high gains of high-frequency signals are required. Further, high breakdown-voltage MOS transistors used to control power sources are required to be highly resistant to voltage. There is a development of a technology for manufacturing a semiconductor device combining such digital circuits and analog circuits or high breakdown-voltage MOS transistors on a SOI substrate.

From the standpoint of substrate noise and gains of high-frequency signals, it has been found that the SOI layer for forming elements thereon had better be thin. In digital circuits, a BOX layer had better be thin as well to control carriers in the body region by back biasing.

From the standpoint of 1/f noise, however, the semiconductor layer between the bottom end of STI and the top surface of the SOI layer had better be thick. This is because channel regions of analog circuits are not connected to common ground contacts located outside STI, or resistance values between analog circuits and ground contacts increase in the case where STI penetrates the SOI layer or the semiconductor layer between the bottom end of STI and the top surface of the SOI layer is excessively thin.

Furthermore, if the BOX layer is thin, capacitance between the SOI layer and the semiconductor bulk increases, and substrate noise of digital circuits is liable to transmit to the semiconductor bulk via the SOI layer. This invites the problem that the substrate noise propagates to analog circuits via the semiconductor bulk. In addition, since a thin BOX layer invites a decrease of the breakdown voltage, a BOX layer suitable for a digital circuit is too thin for a high breakdown-voltage MOS transistor.

As such, digital circuits and analog circuits are different in adequate thickness of BOX layer from each other.

Here is provided a semiconductor substrate having a SOI layer and a BOX layer adequately controlled in thicknesses for digital circuits and analog circuits or high breakdown-voltage MOS transistor, respectively, as well as a semiconductor device and a manufacturing method thereof.

SUMMARY OF THE INVENTION

A semiconductor wafer according to an embodiment of the present invention comprises a semiconductor bulk; a first insulating layer formed on the semiconductor bulk; a first semiconductor layer formed on the first insulating layer; a second insulating layer formed on the first semiconductor layer; and a second semiconductor layer formed on the second insulating layer.

A semiconductor device according to an embodiment of the present invention comprises a semiconductor bulk; a first insulating layer formed on the semiconductor bulk; a first semiconductor layer formed on the first insulating layer; a first transistor formed in a first region of the first semiconductor layer; a second insulating layer formed on a second region of the first semiconductor layer, which is different from the first region; a second semiconductor layer formed on the second insulating layer; and a second transistor formed on the second semiconductor layer.

A semiconductor device according to an embodiment of the present invention comprises a semiconductor bulk; a first insulating layer buried in a first region of the semiconductor bulk; a first transistor formed in the first region on the semiconductor bulk; a second insulating layer provided on a second region of the semiconductor bulk, which is different from the first region; a second semiconductor layer provided on the second insulating layer; and a second transistor formed on the second semiconductor layer.

A semiconductor device according to an embodiment of the present invention comprises a first semiconductor chip which includes a first semiconductor bulk, a first insulating layer formed on the first semiconductor bulk, a first semiconductor layer formed on the first insulating layer and a first transistor formed on the first semiconductor layer; and a second semiconductor chip which includes a second semiconductor bulk, a second insulating layer formed on the second semiconductor bulk, a second semiconductor layer formed on the second insulating layer and a second transistor formed on the second semiconductor layer, wherein the thickness of the second insulating layer is thinner than that of the first insulating layer; the thickness of the second semiconductor layer is thinner than that of the first semiconductor layer, and the second semiconductor chip is bonded on or under the first semiconductor chip.

A method of manufacturing a semiconductor device according to an embodiment of the present invention comprises preparing a semiconductor wafer having a semiconductor bulk, a first insulating layer formed on the semiconductor bulk, a first semiconductor layer formed on the first insulating layer, a second insulating layer formed on the first semiconductor layer and a second semiconductor layer formed on the second insulating layer; removing the second semiconductor layer and a second insulating layer that lie on a first region of the first semiconductor layer; forming a first element-isolating layer which lies on the first semiconductor layer in the first region and not reaching the first insulating layer, and forming a second element-isolating layer which penetrates the second semiconductor layer and the second insulating layer in the second region of the first semiconductor layer other than the first region to reach the first semiconductor layer; forming a first transistor on the first semiconductor layer in the first region; and forming a second transistor on the second semiconductor layer in the second region.

A method of manufacturing a semiconductor device according to an embodiment of the present invention comprises preparing a semiconductor wafer having a semiconductor bulk, an insulating layer formed on the semiconductor bulk, a semiconductor layer formed on the insulating layer; forming a mask material to expose a first surface region of the semiconductor layer and to cover the second surface region of the semiconductor layer other than the first surface region; introducing oxygen ions into the semiconductor bulk in the first surface region using the mask material; thermal annealing the semiconductor wafer to form a first insulating layer in the semiconductor bulk; removing the semiconductor layer and the insulating layer that lie on a first surface region; forming a first element-isolating layer which lies on the semiconductor bulk under the first surface region and not reaching the first insulating layer, and forming a second element-isolating layer which penetrates a second semiconductor layer and a second insulating layer in the second surface region to reach the semiconductor bulk; forming a first transistor on the first semiconductor layer in the first surface region; and forming a second transistor on the second semiconductor layer in the second surface region.

DETAILED DESCRIPTION OF THE INVENTION

Some embodiments of the invention are explained below with reference to the drawings. The embodiments, however, should not be construed to limit the invention.

FIRST EMBODIMENT

Figure 1:
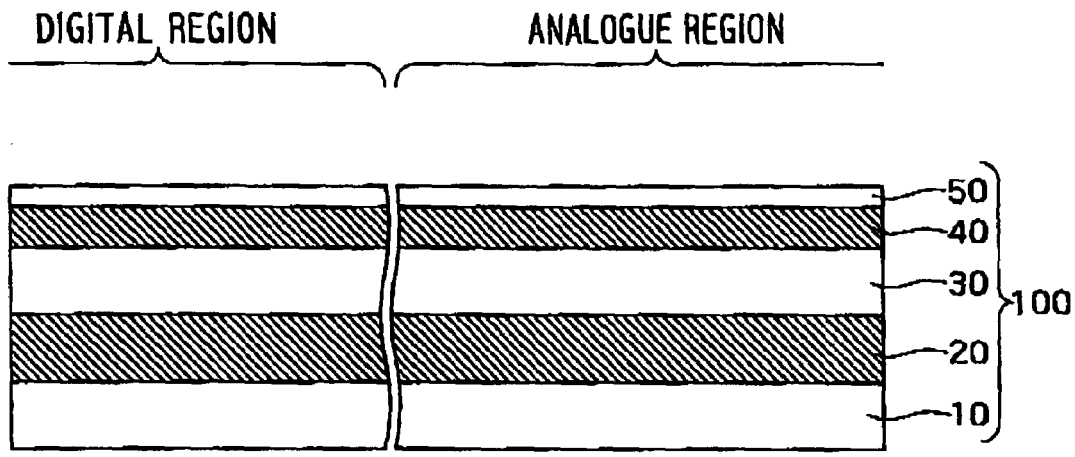
FIGS. 1 through 4 are cross-sectional flow diagrams showing the flow of a manufacturing method of a semiconductor device according to the first embodiment of the invention.

FIGS. 1 through 4 are cross-sectional flow diagrams showing the flow of a manufacturing method of a semiconductor device according to the first embodiment of the invention. FIG. 1 is a cross-sectional view of a semiconductor substrate 100 used to manufacture the semiconductor device. The semiconductor substrate 100 comprises a semiconductor bulk 10, a first buried insulating layer 20 formed on the semiconductor bulk 10, a first semiconductor layer 30 formed on the first buried insulating layer 20, a second buried insulating layer 40 formed on the first semiconductor layer, and a second semiconductor layer 50 formed on the second buried insulating layer 40.

Thickness of the second buried insulating layer 40 is thinner than thickness of the first buried insulating layer 20. For example, thickness of the first buried insulating layer 20 is 1 μm, and thickness of the second buried insulating layer 40 is 10 nm. Thickness of the second semiconductor layer 50 is thinner than thickness of the first semiconductor layer 30. For example, thickness of the first semiconductor layer 30 is 1.5 μm, and thickness of the second semiconductor layer 50 is 10 nm (not exceeding 2 μm). The semiconductor bulk 10, first semiconductor layer 30 and second semiconductor layer 50 are made of silicon single crystal, for example. The first buried insulating layer 20 and the second buried insulating layer 40 are silicon oxide films, for example.

The semiconductor substrate 100 may be made by an ordinary SOI substrate manufacturing method. For example, the semiconductor substrate 100 can be made by bonding three semiconductor substrates having insulating films on their surfaces and polishing their surfaces by CMP or the like. Alternatively, the semiconductor substrate 100 may be made by using a single semiconductor substrate, introducing oxygen ions into locations thereof for the first and second buried insulating films 20, 40, and thereafter annealing the substrate.

For easier explanation, assume here that an analog circuit is formed in a first region (called an analog region as well) in the semiconductor substrate 100 whereas a digital circuit is formed in a second region (called a digital region as well).

Figure 2:
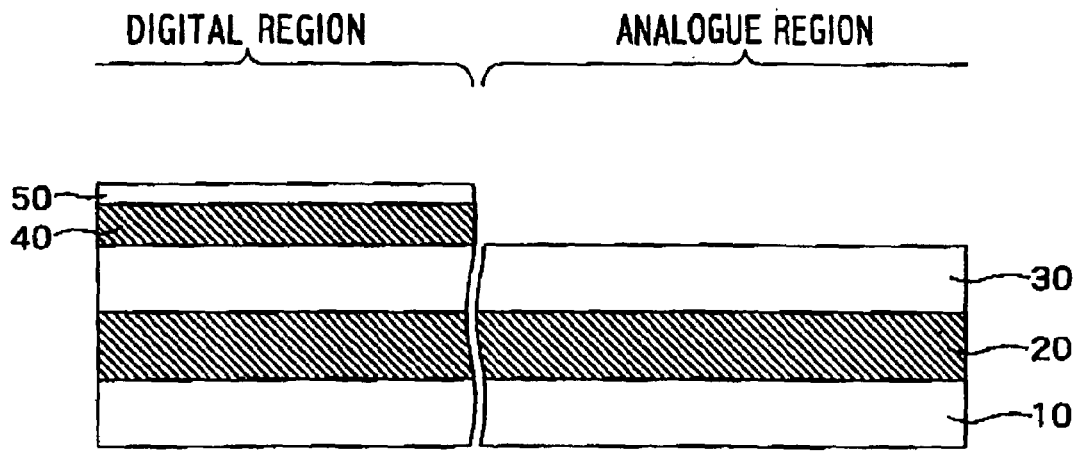

As shown in FIG. 2, the second semiconductor layer 50 and the second buried insulating layer 40 in the analog region are next removed selectively by photolithography and RIE (Reactive Ion Etching). Thereby, the surface of the first semiconductor layer 30 is exposed in the analog region. As being explained later, the digital circuit is formed in the second semiconductor layer 50, and the analog circuit is formed in the first semiconductor layer 30.

Figure 3:
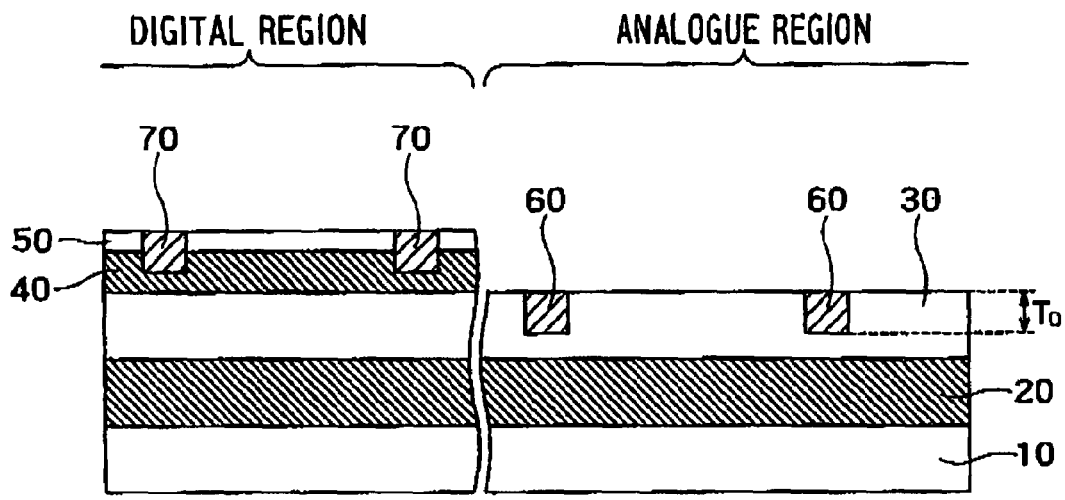

As shown in FIG. 3, STI (Shallow Trench Isolation) 60 and 70 are next formed as first and second element-isolating layers. STI 60 are formed along perimeters of the region for forming analog circuits. STI 60 do not penetrate the first semiconductor layer 30, and do not reach the first buried insulating layer 20. Therefore, the first semiconductor layer 30 lies just under STI 60. Let $T_0$ represent the thickness from the lower end of STI 60 to the bottom surface of the first semiconductor layer 30.

STI 70 may be formed concurrently in the process of forming STI 60. In this case, depth of STI 70 equals the depth of STI 60. However, since the second semiconductor layer 50 is thinner than the first semiconductor layer 30, STI 70 penetrates the second semiconductor layer 50, and reaches the second buried insulating layer 40.

Figure 4:
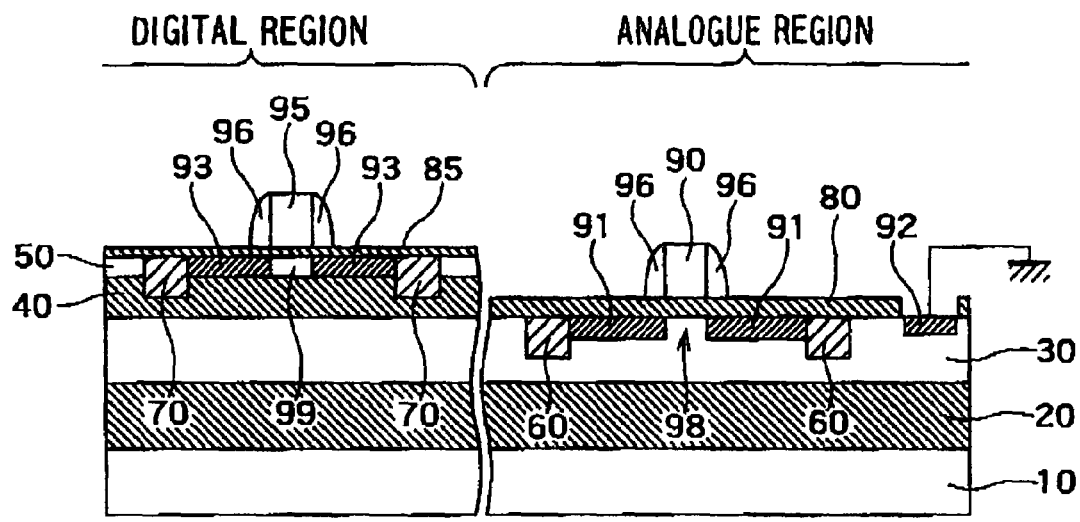

After that, as shown in FIG. 4, elements are formed in the analog region and the digital region, respectively. First formed is a relatively thick gate oxide film 80 in the analog region, and a relatively thin gate insulating film 85 is formed in the digital region. Next formed are gate electrodes 90 and 95 on the gate insulating films 80 and 85. Using these gate electrodes 90 and 95, impurities are introduced to form extension layers in a self-aligned manner. After that, spacers 96 are formed on sidewalls of the gate electrodes 90 and 95, and they are used to form source/drain layers. The extension layers and the source/drain layers in combination form source/drain 91, 93. Simultaneously with the source/drain layers, a ground contact 92 is formed as well. The ground contact 92 may be formed as a guard ring.

FIG. 4 illustrates one transistor in each region. Actually, however, a number of transistors are formed to make analog circuits in the analog region and digital circuits in the digital region, respectively. In the analog region, high breakdown-voltage MOSFETs may be formed instead of, or in addition to, analog circuits.

Each transistor in the digital region includes a source/drain 93 formed in the thinner second semiconductor layer 50. Therefore, the source/drain 93 reaches the second buried insulating film 40. Each transistor in the digital region has a body region 99 surrounded by a source/drain 93, a second buried insulating film 40 and a gate insulating film 85.

[In re Thickness of the Second Semiconductor Layer 50]

Figure 5:
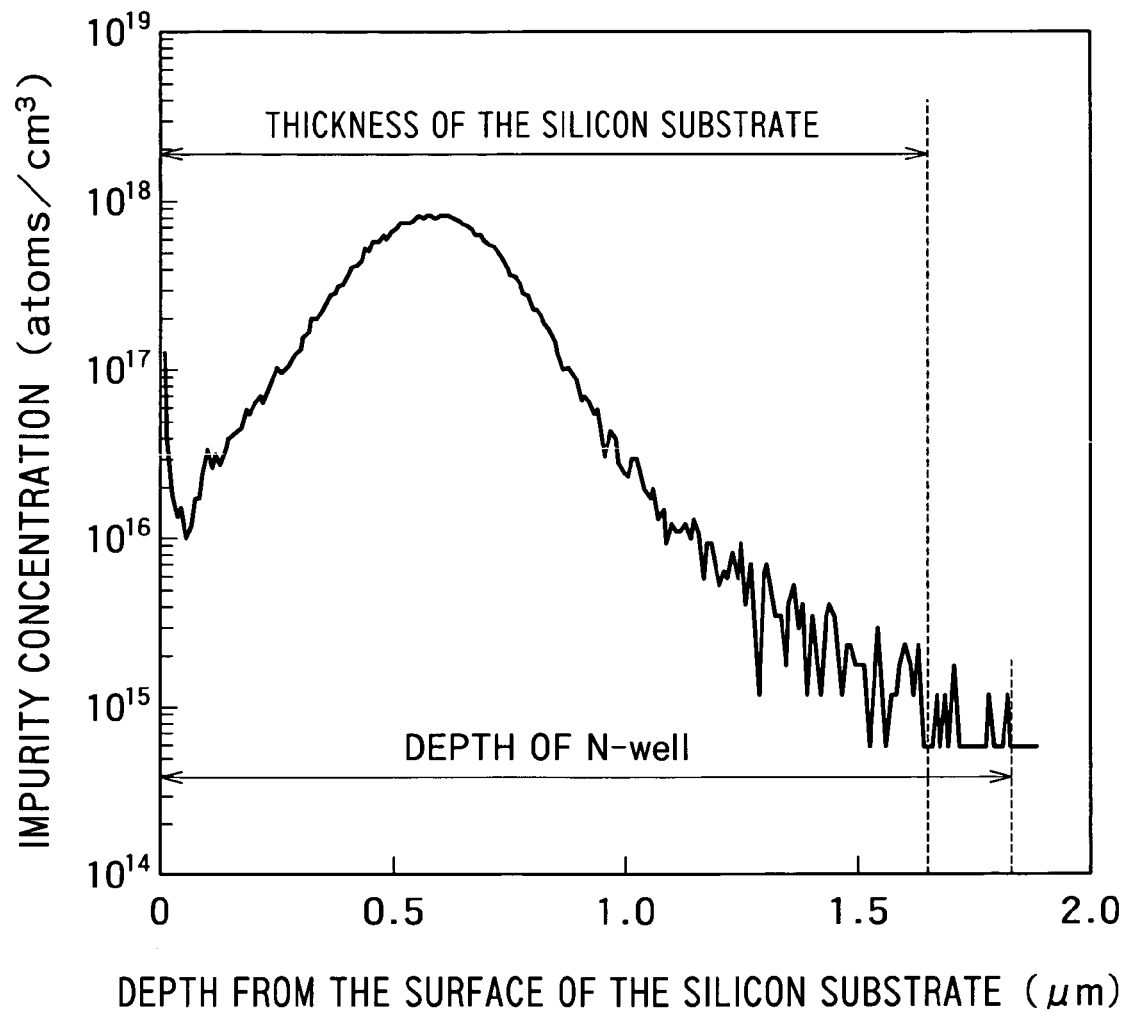
FIG. 5 is a graph showing a relation between concentration of impurity and depth from a surface of the semiconductor substrate.

As shown in FIG. 5, it is desirable that thickness of the second semiconductor layer 50 is approximately equal to the depth of a well diffusion layer to be formed in the digital region. In the example of FIG. 5, if the depth of the n-type well is 1.9 µm, then the thickness of the second semiconductor layer 50 is approximately 1.7 µm. Results obtained thereby are shown in FIGS. 6. and 7.

Figure 6:
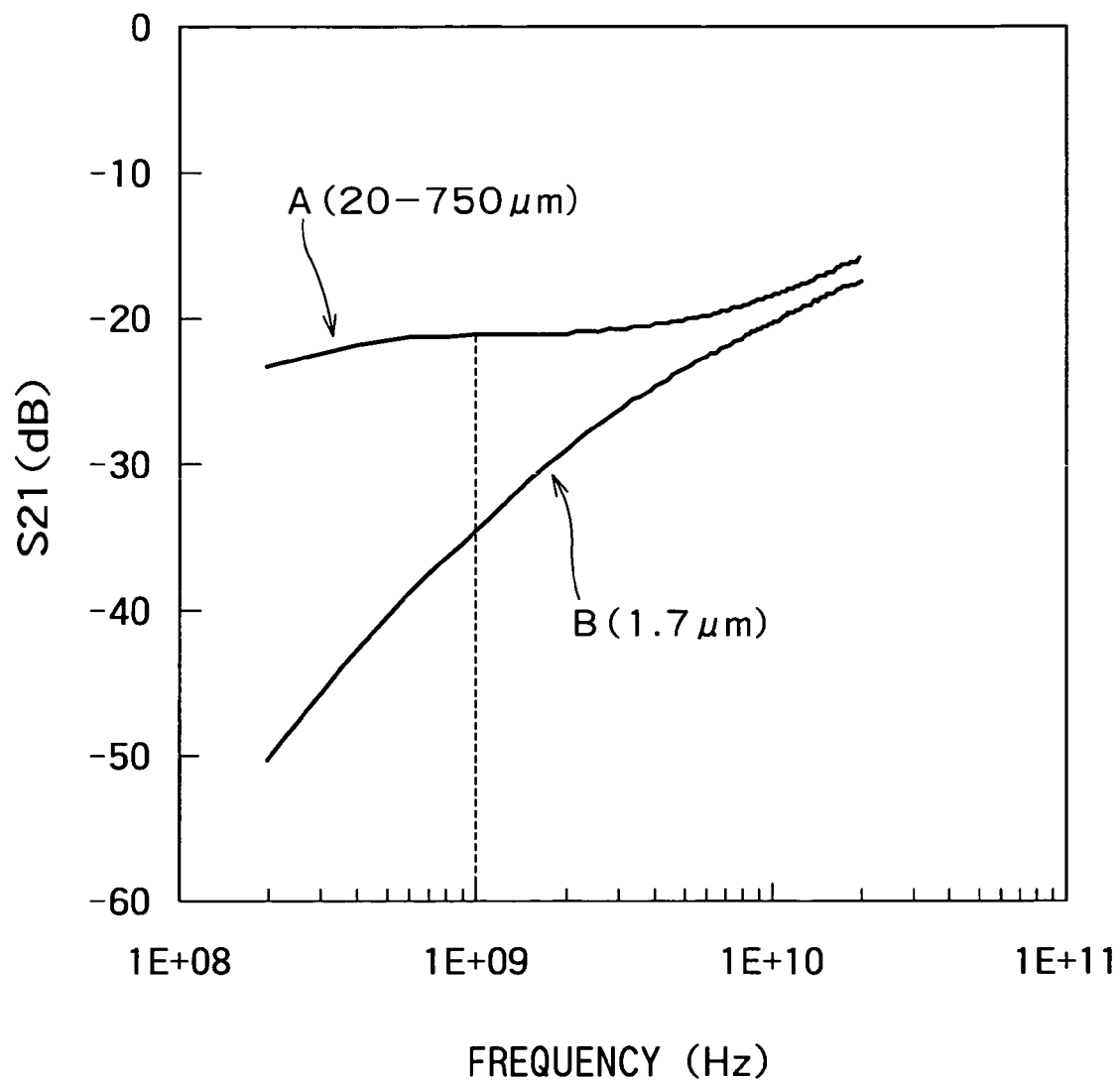
FIG. 6 is a graph that shows signal transit characteristics S21 relative to signal frequencies.

FIG. 6 is a graph that shows signal transit characteristics S21 relative to signal frequencies. This graph shows signal transit characteristics between two n-type wells sandwiching a p-type well in a structure having an n-type well, p-type well and n-type well aligned side by side in this order. The curve A shows characteristics obtained when the second semiconductor layer 50 is 20 to 750 µm. The curve B shows characteristics obtained when the second semiconductor layer 50 is 1.7 µm. This graph demonstrates that the curve B is worse than the curve A in transit characteristics. That is, it demonstrates noise cannot pass through easily. Especially when the signal frequency is equal to or lower than 10 GHz, the difference in transit characteristics between the curves A and B becomes large.

Figure 7:
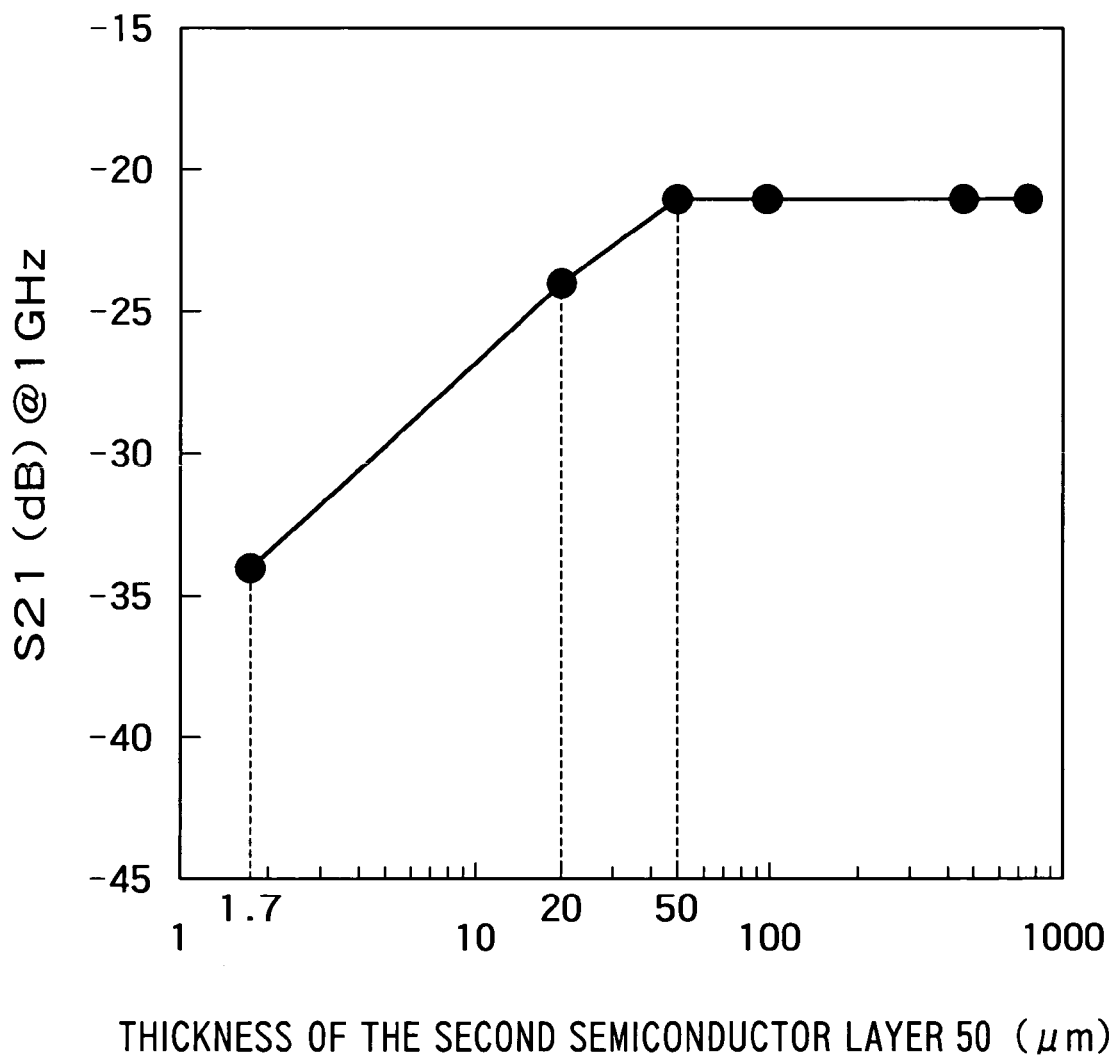
FIG. 7 is a graph that shows transit characteristics S21 of 1 GHz signals. The abscissa indicates thickness of the second semiconductor layer 50.

FIG. 7 is a graph that shows transit characteristics S21 of 1 GHz signals. The abscissa indicates thickness of the second semiconductor layer 50. When the thickness of the second semiconductor layer 50 is equal to or larger than 50 µm, the transit characteristics S21 are relatively larger. When the thickness of the second semiconductor layer 50 is around 1.7 µm, the transit characteristics S21 become smaller by approximately 15 dB than that obtained when the thickness is 50 µm or more. As shown in FIG. 6 and FIG. 7, by reducing the thickness of the second semiconductor layer 50 to the level of the depth of the well diffusion layer, it is possible to suppress the transit of the substrate noise from the digital region to the analog region.

Figure 8:
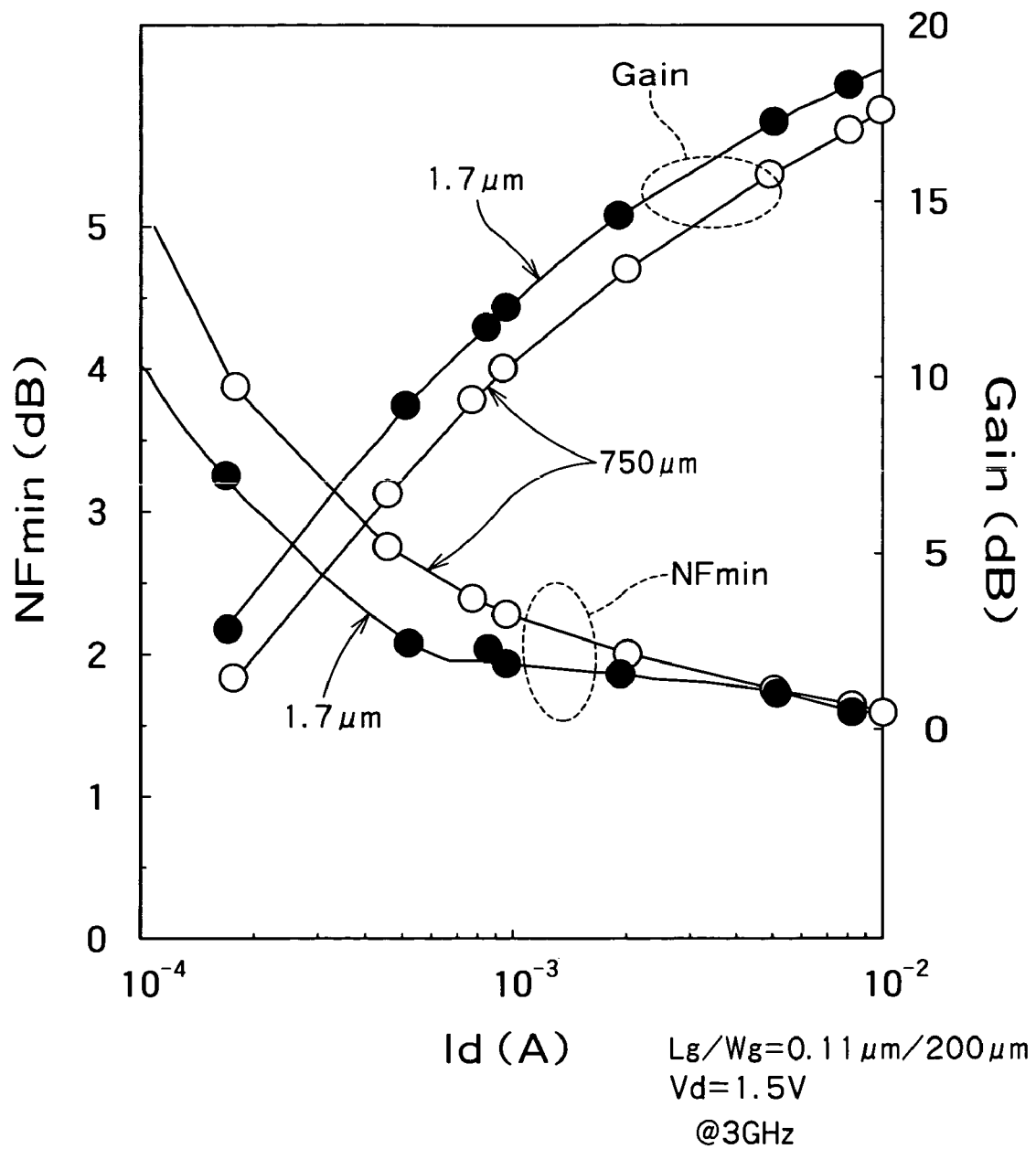
FIG. 8 is a graph that shows gains (Gain) of signals output from the drain of an analog circuit when high-frequency signals are input to MOSFET as well as minimum values (Nfmin) of noise contained in the output signals.

FIG. 8 is a graph that shows gains (Gain) of signals output from the drain of an analog circuit when high-frequency signals are input to MOSFET as well as minimum values (Nfmin) of noise contained in the output signals. The abscissa indicates drain current values Id of the analog circuit. The drain voltage Vd of the analog circuit is 1.5 V, and frequency of the input signals to the gate is 3 GHz. Gate length Lg and gate width Wg are 11 µm and 200 µm, respectively.

As shown in FIG. 8, it has been confirmed that, when the first semiconductor layer 30 is 1.7 µm thick, both the signal gains (Gain) of the analog circuit and the noise minimum values (Nfmin) are improved than those obtained when the thickness is 750 µm. Part of input signals to the gate is not amplified by the analog circuit, and penetrates to the drain of the analog circuit through the first semiconductor layer 30. Here is assumed that the gains (Gain) of signals are improved because that component is small when the thickness of the first semiconductor layer 30 is 1.7 µm. Further, once the signals pass through the first semiconductor layer 30, a thermal noise is added to the signals. If the thickness of the first semiconductor layer 30 is 1.7 µm, the signal component penetrating the first semiconductor layer 30 is small in amount, and the noise minimum values Nfmin are improved as well.

Figure 9:
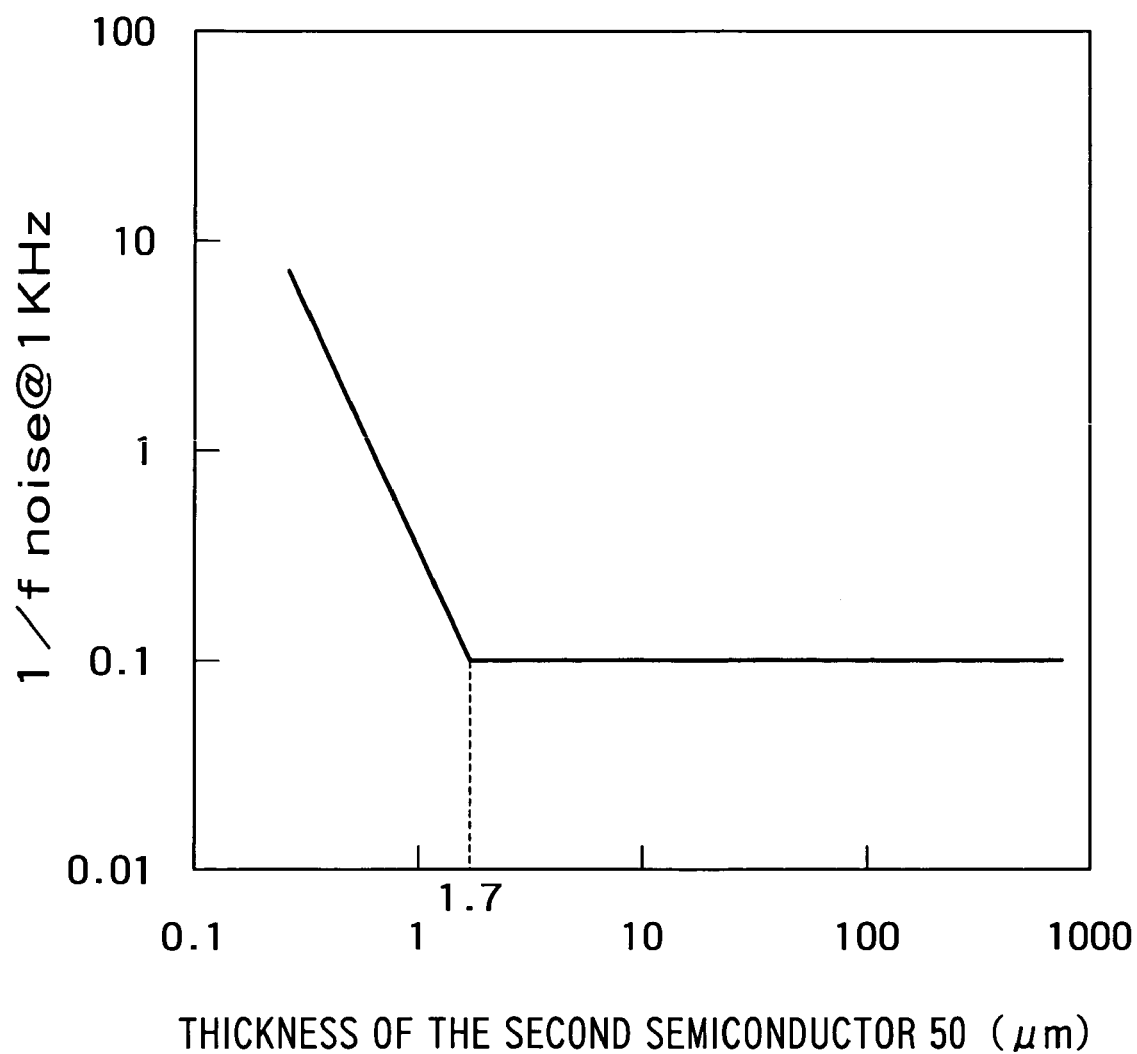
FIG. 9 is a graph that shows 1/f noise relative to thickness of the second semiconductor layer 50.

FIG. 9 is a graph that shows 1/f noise relative to thickness of the second semiconductor layer 50. This graph demonstrates that 1/f noise increases when the thickness of the second semiconductor layer 50 is smaller than 1.7 µm. Here is confirmed that 1/f noise increases when the second semiconductor layer 50 is excessively thinner than the depth of the well diffusion layer.

As such, taking account of the trade-off relation of the substrate noise, noise minimum values and gains of signals to the 1/f noise, thickness of the second semiconductor layer 50 is preferably in the same level as the depth of the well diffusion layer.

[In Re Thickness of the Second Buried Insulating Film 40]

Thickness of the second buried insulating film 40 is 10 nm or less, for example. By thinning the second buried insulating film 40 to this level, it is possible to control potential of the body region 99 with back biasing through the second buried insulating film 40. As a result, behaviors of digital circuits can be stabilized and enhanced in speed.

[In Re Thickness of the First Semiconductor Layer 30]

The channel region 98 (see FIG. 4) of a transistor in the analog region is electrically connected to the ground contact 92 via the first semiconductor layer 30 lying just under STI 60. If the distance To from the lower end of STI 60 to the bottom surface of the well of the first semiconductor layer 30 is 200 nm, then the resistance value R from the channel region 98 to the ground contact 92 is preferably equal to or lower than 500 ohm, so that noise is easily absorbed to the ground contact 92 (guard ring).

$$R = A*\rho/(b*T_0) \tag{1}$$

The term $\underline{A}$ in Equation 1 is the distance from the source/drain 91 in the analog region to the ground contact 92. The term b is the width by which the source drain 91 is opposed to the ground contact 92. The term $\rho$ is the specific resistance from the source drain 91 to the ground contact 92.

As such, thickness of the first semiconductor layer 30 is preferably thicker than the depth of STI 60. To reduce the resistance value R, thickness of the first semiconductor layer 30 is more preferably thicker by 200 nm or more than the depth of STI 60.

Since the channel region 98 is isolated from the digital region and electrically connected to the ground, analog circuits become less affected by substrate noise and 1/f noise.

[In Re Thickness of the First Buried Insulating Film 20]

Transistors in the analog region are formed on the first buried insulating film 20 that is thicker than the second buried insulating film 40. Thickness of the first buried insulating film 20 is 600 nm, for example.

Let the impedance from a well in the analog region to the ground contact (guard ring) be 10 ohm. In this case, if the frequency of the substrate noise is 1 MHz, it corresponds to the capacitance of 15 nF. If the capacitance between the fist semiconductor layer 30 and the semiconductor bulk 10 is equal to or larger than 15 nF, it may occur that the substrate noise is not absorbed in the ground contact but rather propagates to the semiconductor bulk 10. If the area of the digital region is 500 µm×500 µm, then the thickness of the first buried insulating film is 600 nm or more. Further, when a resistance of the semiconductor bulk 10 is low, the noise propagates to other elements through the semiconductor bulk 10. Therefore, it is preferred that the resistance of the semiconductor bulk 10 is higher than 500 ohm.

Figure 10:
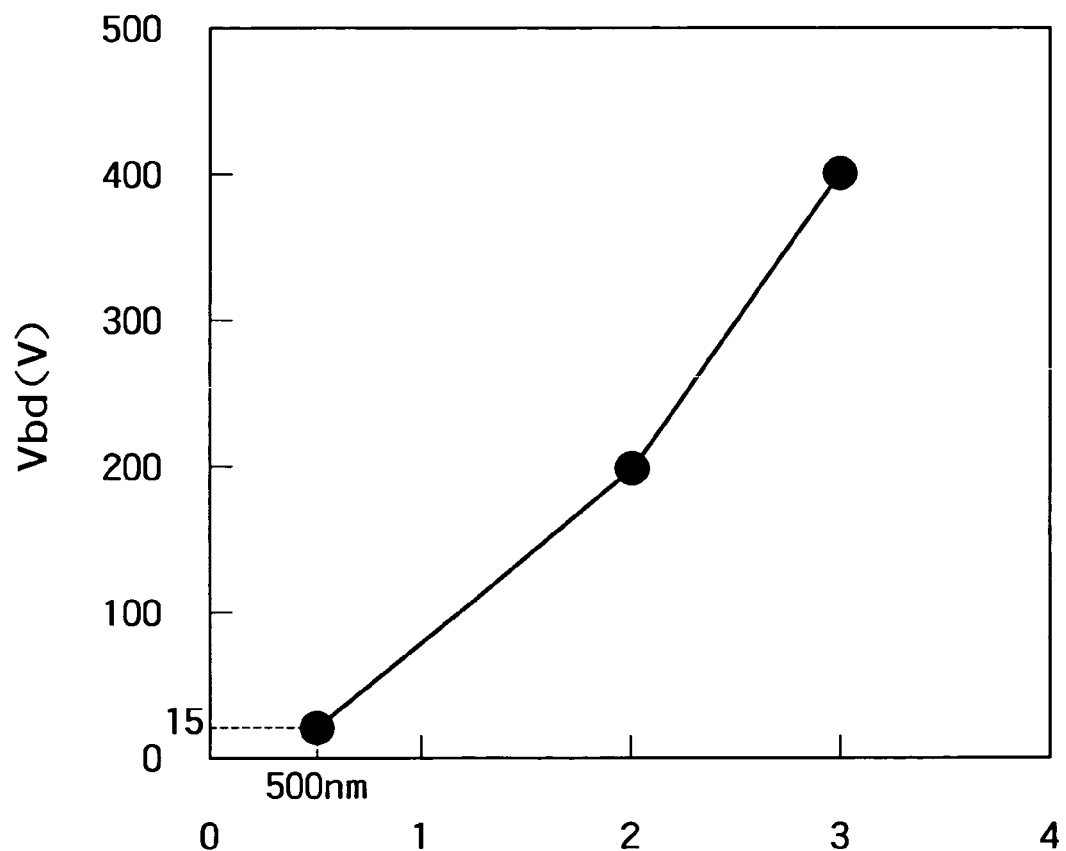
FIG. 10 is a graph that shows a relation between the breakdown voltage (Vbd) of the high breakdown-voltage MOS transistor and the thickness of the first buried insulating film 20.

In the case where a high breakdown-voltage MOS transistor is formed in the analog region, in the high breakdown-voltage MOS transistor, thickness of the first buried insulating film 20 is determined in depending upon the breakdown voltage (Vbd). FIG. 10 is a graph that shows a relation between the breakdown voltage (Vbd) of the high breakdown-voltage MOS transistor and the thickness of the first buried insulating film 20. When the device is used in a LCD driver, the breakdown voltage (Vbd) is required to be at least 15 V. In this case, it is apparent from the graph of FIG. 10 that the thickness of the first buried insulating layer 20 must be equal to or larger than 500 nm.

In addition to STI 60 and 70, STI (not shown) penetrating the first semiconductor layer 30 may be provided between the analog region and the digital region. By using this STI to isolate the analog region from the digital region, it is possible to suppress propagation of substrate noise from the digital region to the analog region. In this case, from the viewpoint of substrate noise, the first semiconductor layer 30 and the second semiconductor layer 50 need not be limited in thickness. However, depending upon the depth of STI penetrating the first semiconductor layer 30, thickness of the first semiconductor layer 30 is restricted.

As such, the first embodiment can provide a semiconductor device including a SOI layer and a BOX layer that are adequately controlled in thickness for digital circuits and analog circuits, or high breakdown-voltage MOS transistors, respectively.

SECOND EMBODIMENT

Figure 11:
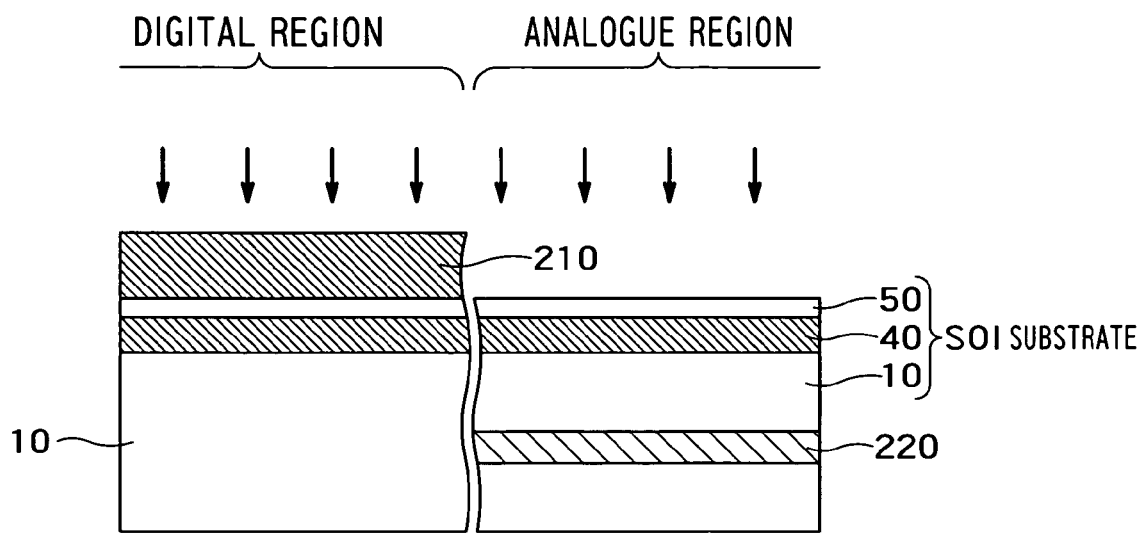
FIG. 11 and FIG. 12 are cross-sectional flow-diagrams that show the flow of a manufacturing method of a semiconductor device according to an embodiment of the invention.
Figure 12:
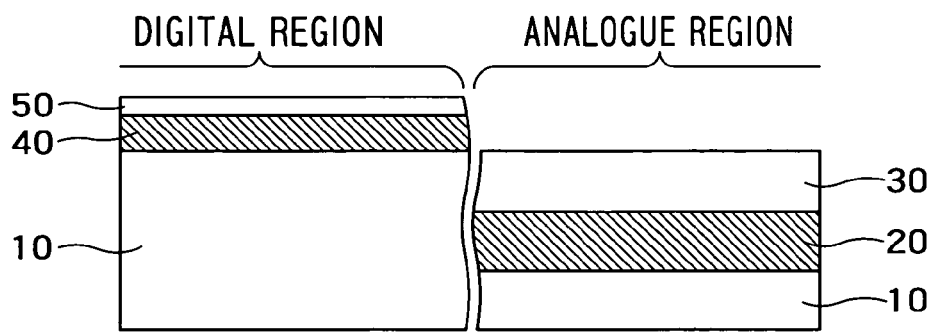

FIG. 11 and FIG. 12 are cross-sectional flow diagrams that show the flow of a manufacturing method of a semiconductor device according to an embodiment of the invention. As shown in FIG. 11, first prepared is a SOI substrate that comprises a semiconductor bulk 10, a second buried insulating layer 40 and a second semiconductor layer 50. A mask material 210 is next formed to locally expose the analog region in the second semiconductor layer and to cover the second semiconductor layer 50 in the digital region other than the analog region. The mask material 210 is next used for ion injection of oxygen into the semiconductor bulk 10 in the analog region. In this process, distance from the surface of the semiconductor bulk 10 to the layer 220 including injected oxygen is larger than the thickness of the second semiconductor layer 50. The mask material 210 may be a silicon oxide film, for example.

The SOI substrate is next annealed. As a result, as shown in FIG. 12, the oxygen layer 220 oxidizes the semiconductor bulk 10 to form the first buried insulating layer 20. In this case, the semiconductor region on the first buried insulating layer 20 in the analog region is used as the first semiconductor layer 30. The mask material 210 is further used to locally remove the second semiconductor layer 50 and the second buried insulating layer 40 in the analog region. As a result, a structure equivalent to the structure of FIG. 2 is obtained. Thereafter, through the steps shown in FIG. 3 and FIG. 4, electronic elements can be formed in the analog region and the digital region.

As such, the manufacturing method according to the second embodiment can manufacture a semiconductor device equivalent to that manufactured by the first embodiment.

THIRD EMBODIMENT

Figure 13A:
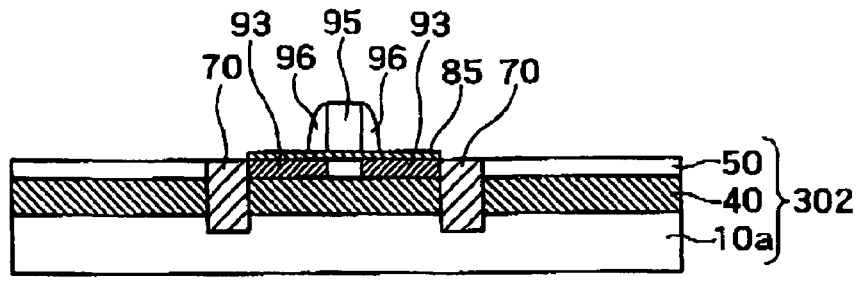
FIGS. 13A through 14 are cross-sectional flow diagrams that show the flow of a manufacturing method of a semiconductor device according to the third embodiment of the invention.
Figure 13B:
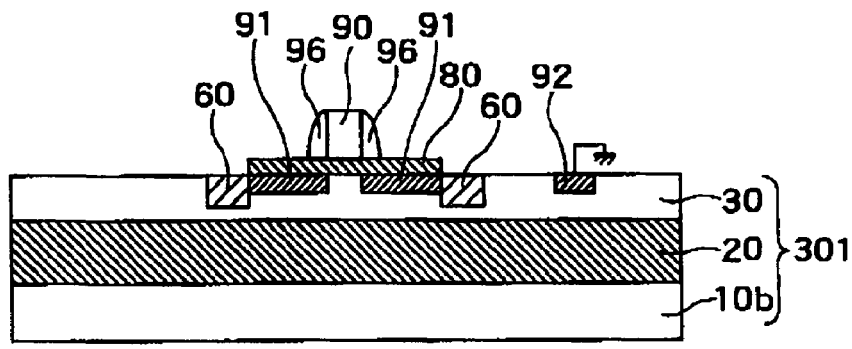
Figure 14:
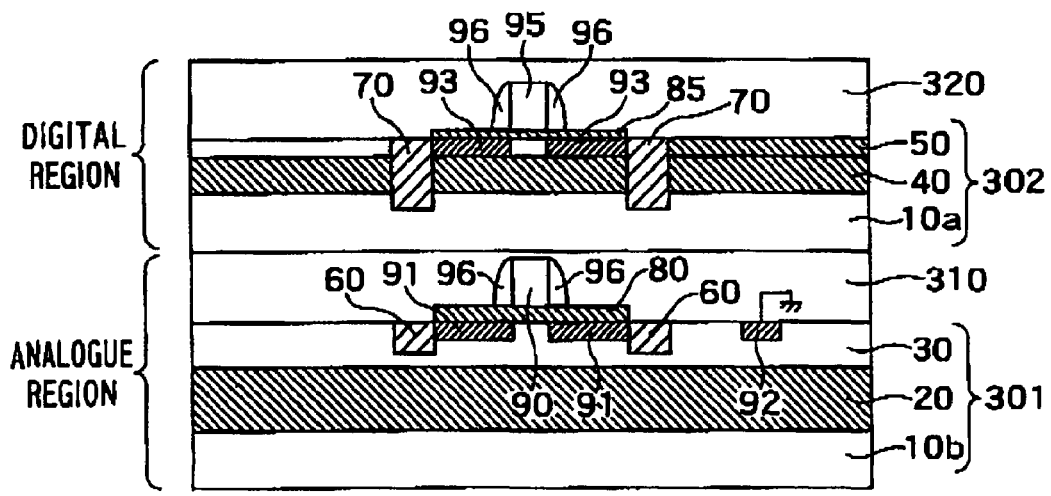

FIGS. 13A through 14 are cross-sectional flow diagrams that show the flow of a manufacturing method of a semiconductor device according to the third embodiment of the invention. In the third embodiment, digital circuits and analog circuits are formed on different SOI substrates, and these SOI substrates are bonded together.

As shown in FIG. 13A and FIG. 13B, SOI substrates 302 and 301 are prepared. The SOI substrate 302 comprises a semiconductor bulk 10a, a second buried insulating layer 40 and a second semiconductor layer 50. The SOI substrate 302 comprises a semiconductor bulk 10b, a first buried insulating layer 20 and a first semiconductor layer 30. The first buried insulating layer 20, the first semiconductor layer 30, the second buried insulating layer 40 and the second semiconductor layer 50 may be identical to the components denoted by the common reference numerals in the first embodiment.

Thereafter, electronic devices are formed in the digital region and the analog region, respectively. STIs 60 and 70 may be identical to those having the common reference numerals in the first embodiment. However, since STI 60 and 70 are made in different steps, they may be different in thickness.

As shown in FIG. 14, the SOI substrate 301 and 302 are stacked. In this process, a protective layer 310 is provided between the SOI substrates 301 and 302. The protective layer 310 not only protects the analog circuit of the SOI substrate 301 but also serves as an adhesive between the SOI substrates 301 and 320. The protective layers 310, 320 are made of an insulating material.

According to the third embodiment, substrate noise and 1/f noise do not propagate from digital circuits to analog circuits. Therefore, the first buried insulating layer 20, the first semiconductor layer 30, the second buried insulating layer 40 and the second semiconductor layer 50 can be determined without the need of taking account those noises. In addition, the third embodiment can diminish the chip size because the digital region and the analog region are stacked. Moreover, the third embodiment has the same effects as those of the first embodiment as well.

The invention claimed is:

1. A semiconductor device comprising:
   a semiconductor bulk;
   a first insulating layer formed on the semiconductor bulk;
   a first semiconductor layer formed on the first insulating layer;
   a first transistor formed in a first region of the first semiconductor layer;
   a second insulating layer formed on a second region of the first semiconductor layer;
   a second semiconductor layer formed on the second insulating layer;
   a second transistor formed on the second semiconductor layer;
   a first element-isolating layer provided on a periphery of the first transistor; and
   a second element-isolating layer provided on a periphery of the second transistor,
   wherein the first and the second element-isolating layers do not reach the first insulating layer, and
   wherein the second element-isolating layer reaches the second insulating layer.

2. The semiconductor device according to claim 1, wherein the thickness of the second insulating layer is thinner than that of the first insulating layer, and wherein the thickness of the second semiconductor layer is thinner than that of the first semiconductor layer.

3. The semiconductor wafer according to claim 1, wherein the thickness of the first insulating layer is equal to or more than 500 nm, and wherein the thickness of the second insulating layer is equal to or less than 10 nm.

4. The semiconductor wafer according to claim 1, wherein the thickness of the first semiconductor layer is equal to or more than 1 µm, and wherein the thickness of the second semiconductor layer is equal to or less than 15 nm.

5. The semiconductor wafer according to claim 1, wherein the second transistor is used to construct digital circuits, and wherein the first transistor is used to construct analogue circuits or high breakdown-voltage transistors.

6. The semiconductor wafer according to claim 1, further comprising:

a ground contact provided on a periphery of the first element-isolating layer, wherein resistance value from a channel region of the first transistor to the ground contact via the first semiconductor layer just under the first element-isolating layer is equal to or lower than 500 ohm.

* * * * *